United States Patent [19]
Cheo

[11] Patent Number: 5,497,050
[45] Date of Patent: Mar. 5, 1996

[54] ACTIVE RF CAVITY INCLUDING A PLURALITY OF SOLID STATE TRANSISTORS

[75] Inventor: Bernard R. Cheo, Teaneck, N.J.

[73] Assignee: Polytechnic University, Brooklyn, N.Y.

[21] Appl. No.: 2,603

[22] Filed: Jan. 11, 1993

[51] Int. Cl.⁶ .............................. H05H 9/00; H03F 3/60
[52] U.S. Cl. .................... 315/5.41; 315/500; 315/505; 330/295; 330/56
[58] Field of Search ....................... 330/295, 286, 330/56; 315/500, 505, 5.41, 5.42

[56] References Cited

U.S. PATENT DOCUMENTS

| | | | |
|---|---|---|---|
| 3,733,560 | 5/1973 | Oltman, Jr. et al. | 330/56 X |
| 3,775,694 | 11/1973 | Quine | 330/56 |
| 4,103,262 | 7/1978 | Woodward | 333/136 |
| 4,251,784 | 2/1981 | Luetzelschwab et al. | 333/127 |
| 4,453,139 | 6/1984 | Labaar | 330/56 X |
| 4,647,869 | 3/1987 | Kaneko | 330/295 X |
| 4,700,145 | 10/1987 | Yelland et al. | 330/286 |
| 4,707,668 | 11/1987 | Hoffert | 330/56 |
| 4,812,782 | 3/1989 | Ajioka | 330/295 X |
| 4,825,175 | 4/1989 | Tsuda et al. | 330/295 X |
| 5,121,083 | 6/1992 | Bauer et al. | 330/286 X |

FOREIGN PATENT DOCUMENTS

| | | |
|---|---|---|
| 0345006 | 12/1989 | European Pat. Off. . |
| 493081 | 7/1992 | European Pat. Off. .................. 330/56 |
| 2083888 | 12/1971 | France . |
| 147011 | 11/1980 | Japan ..................................... 330/286 |

OTHER PUBLICATIONS

IEEE Transactions on Nuclear Science, vol. NS-30, No. 2, Apr. 1983, New York, pp. 1402–1404.

Primary Examiner—Benny T. Lee
Attorney, Agent, or Firm—William S. Frommer

[57] ABSTRACT

An active RF cavity is defined by a conductive wall in which a plurality of solid state power amplifiers are mounted. The solid state power amplifiers induce an RF current at an inner surface of the wall to form an oscillating electromagnetic (EM) field within the cavity. Preferably, the power amplifiers are in the form of modules that contain a number of RF power chips. The structure operates as both a power combiner and a matching transformer and is powered by a relatively low voltage d.c. source. A high-amplitude field is generated using equipment that is more efficient and much lighter in weight than conventional equipment. Such a cavity may be applied in a drift tube linac, an RF quadrupole linac, a linac having aligned cavities, and in other types of particle accelerators, and as a high power RF amplifier with the EM waves piped out via a waveguide or a coaxial cable.

18 Claims, 5 Drawing Sheets

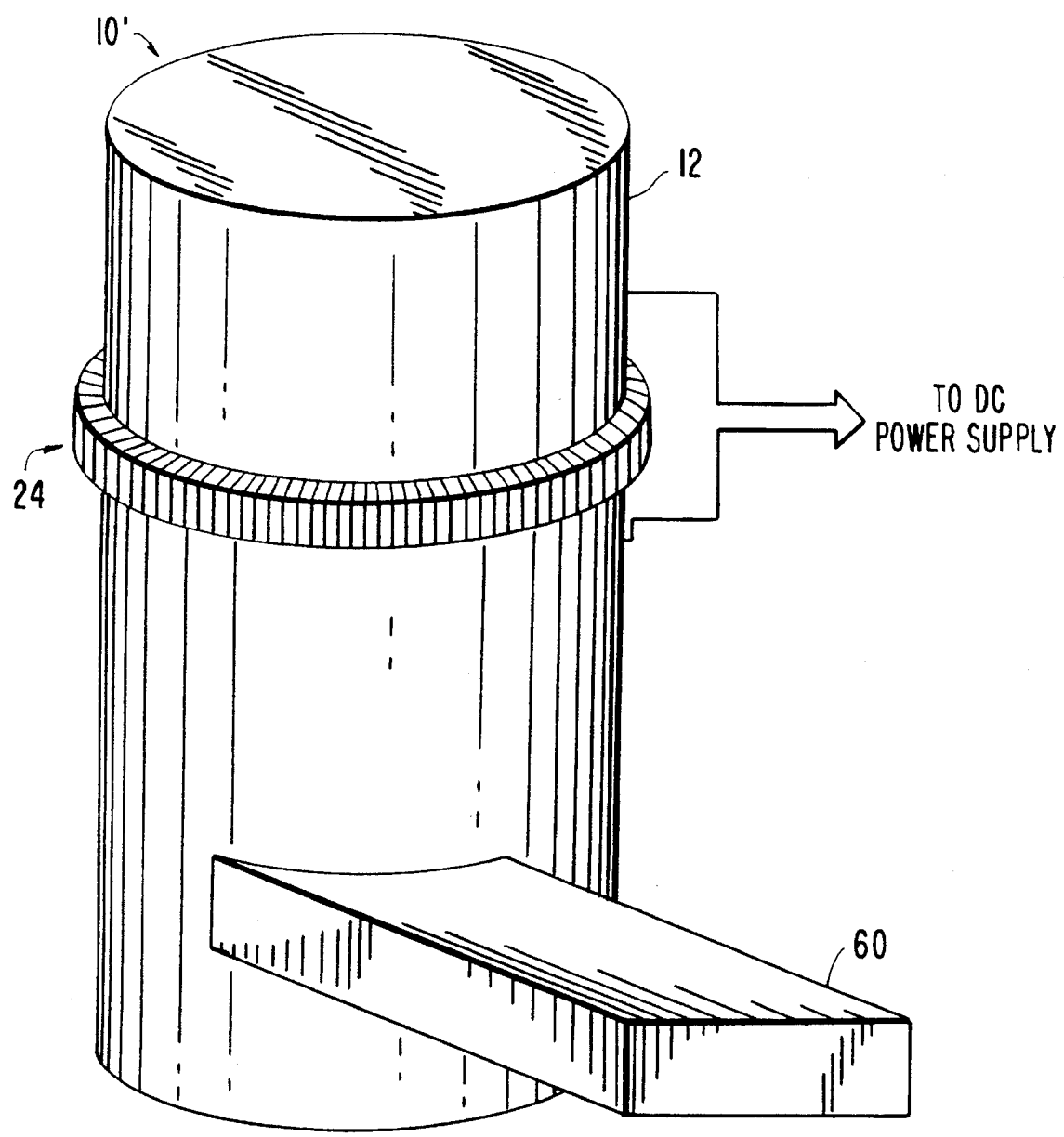

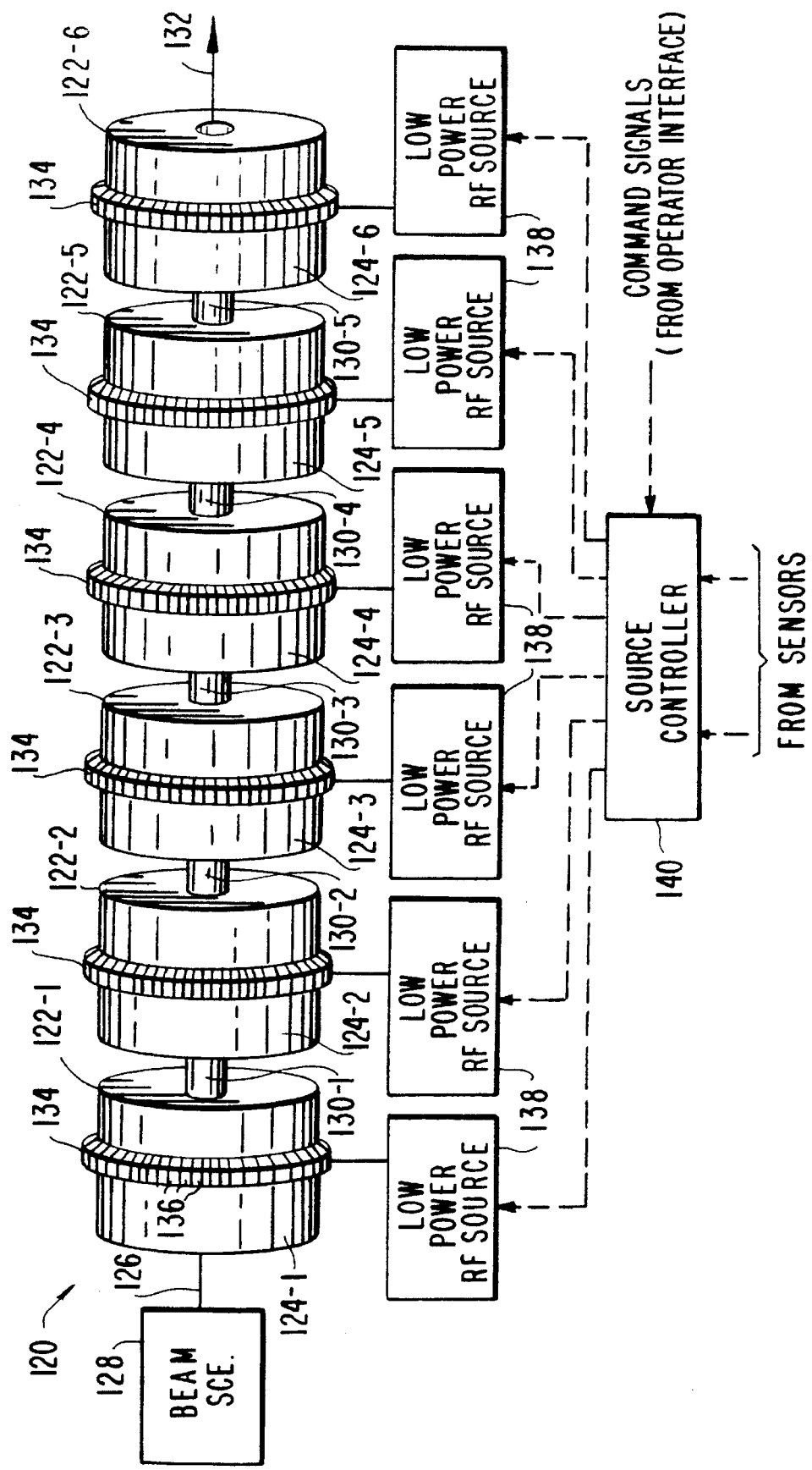

ACTIVE RF CAVITY INCLUDING A PLURALITY OF SOLID STATE TRANSISTORS

This invention relates to high-frequency electromagnetic (EM) field generating cavities, and more particularly to such cavities in which high power output is to be achieved.

It is known to generate high frequency EM fields in a cavity for the purpose, e.g., of accelerating a charged particle beam in a radio frequency (RF) accelerator, such as a linear accelerator. In a typical construction of a linear accelerator, RF power is generated in a number of vacuum tube amplifiers operating at a high voltage (tens of kilovolts) and the amplified RF power is transmitted from the RF tubes to the cavity by means of a coaxial cable, or the like, to form an oscillating field inside the cavity. One common type of linear accelerator (linac), the drift tube linac (DTL), has a series of drift tubes which are arranged within the cavity so that the particles are accelerated by the electric field to form the desired particle beam.

There are a number of applications or potential applications for which relatively light-weight and easily transportable linacs would be desirable. These applications include earth-orbit based applications and decentralized, on-demand production of medical isotopes, among others. However, the substantial weight and size of the necessary RF tubes, high voltage power supply and power conditioning equipment, and associated components, has been a significant deterrent to use of linacs for these purposes.

Accordingly, it is an object of the present invention to provide a high-power RF cavity that eliminates or alleviates the foregoing problems; specifically, it is an object to provide a high-power RF cavity which is relatively light in weight, is relatively easy to transport, and is efficient in generating the EM field.

It is another object of the present invention to provide a high-power RF cavity that operates with a relatively low voltage power supply.

It is a further object of the invention to provide a high-power RF cavity in which adjustments can be conveniently made to the characteristics of the generated EM field.

It is still another object of the invention to provide an efficient high-power RF amplifier.

According to the present invention, the foregoing objects are met by the provision of an active RF cavity which includes a conductive wall that defines the cavity, and a plurality of solid state power amplifiers mounted within the conductive wall for inducing an RF current at an inner surface of the conductive wall to form an oscillating EM field within the cavity.

According to an aspect of the invention, the cavity is substantially cylindrical and the conductive wall includes two cylindrical sections with the solid state power amplifiers arranged in modules installed between the sections and each of the modules includes a plurality of the solid state power amplifiers. According to another aspect of the invention, a positive d.c. power terminal is connected to one of the cylindrical sections and a negative d.c. power terminal is connected to the other of the cylindrical sections. According to yet another aspect of the invention, the positive and negative d.c. power terminals are at respective potential levels that differ by no more than 1,000 volts, and the generated field has a peak amplitude of at least 100 KV per meter. According to a further aspect of the invention, the field has a peak amplitude of at least 1 MV per meter.

According to a further aspect of the invention, the conductive wall includes at least three cylindrical sections and the solid state power amplifiers are arranged in a plurality of arrays of modules, each of the arrays is installed between a respective adjacent pair of the at least three cylindrical sections, and each of the modules includes a plurality of the solid state power amplifiers.

According to still another aspect of the invention, the cavity includes means for taking out high-power EM waves from the cavity.

According to an additional aspect of the invention, the cavity includes means for introducing charged particles into the cavity so that the charged particles are accelerated by the oscillating EM field.

According to another aspect of the invention, a means is disposed within the cavity for applying the oscillating EM field to charged particles so that the cavity functions as a particle accelerator.

According to yet another aspect of the invention, the cavity has signal source means for applying respective RF driving signals to the solid state power amplifiers, sensor means disposed within the cavity for sensing a characteristic of the EM field, and means responsive to the sensor means and connected to the signal source means for adjusting the respective RF driving signals as to phase and/or amplitude.

Also in accordance with the invention, a radio frequency quadrupole (RFQ) includes a substantially cylindrical conductive wall for defining a resonant cavity, and four conductive vanes that extend radially inwardly from, and longitudinally along, an inner surface of the conductive walls and that are circumferentially spaced apart from each other. A plurality of solid state power amplifiers are mounted within the conductive wall for inducing an RF current at inner surfaces of the conductive wall and vanes so that an oscillating EM field is formed within the cavity. According to other aspects of the invention, the solid state power amplifiers are arranged in four linear arrays that extend longitudinally along the conductive wall circumferentially intermediate the four conductive vanes, with the linear arrays being made up of a plurality of modules that are installed within the conductive wall and that each include a plurality of the solid state power amplifiers. According to a further aspect of the invention, the RFQ has means for introducing charged particles into the resonant cavity, and the charged particles are accelerated and formed into a high-energy beam by the EM field.

There is also provided in accordance with the invention a charged particle accelerator which includes respective conductive walls that define a plurality of resonant cavities that are aligned and interconnected by aperture portions arranged between adjacent pairs of the cavities for accommodating a particle beam that passes through the aligned cavities. The accelerator just described further includes respective pluralities of solid state power amplifiers mounted within the conductive walls for inducing RF currents at inner surfaces of the conductive walls so that respective oscillating EM fields are formed within the cavities.

According to another aspect of the invention, in the accelerator as described just above, the resonant cavities are substantially cylindrical and the respective pluralities of solid state power amplifiers are arranged within respective pluralities of modules that form annular arrays in the respective conductive walls and each of the modules includes a plurality of the solid state power amplifiers. According to a further aspect of the invention, the accelerator also includes signal source means for applying RF driving signals to the respective pluralities of the solid state power amplifiers.

An active RF cavity in accordance with the invention is a relatively low weight device, using a low voltage power source while providing a high-power EM field. The cavity itself functions as a power combiner and matching transformer in which a large number of solid state power amplifiers/modules can be efficiently combined. By adjusting the respective RF driving signals, characteristics of the EM field can be controlled.

BRIEF DESCRIPTION OF THE DRAWINGS

It is not intended that the invention be summarized here in its entirety. Rather, further features, aspects and advantages of the invention will be set forth in or apparent from the following description and drawings. In the drawings wherein like reference numerals are used to identify like elements:

FIG. 4 is a partial-schematic perspective view of an RF amplifier in accordance with the present invention;

FIG. 6 is a perspective view of a linac with plural aligned cavities in accordance with the present invention.

DESCRIPTION OF THE PREFERRED EMBODIMENTS

Drift Tube Linac

A drift tube linac (DTL) having an integrated transistorized power supply will now be described with reference to FIG. 1.

Figure 1:
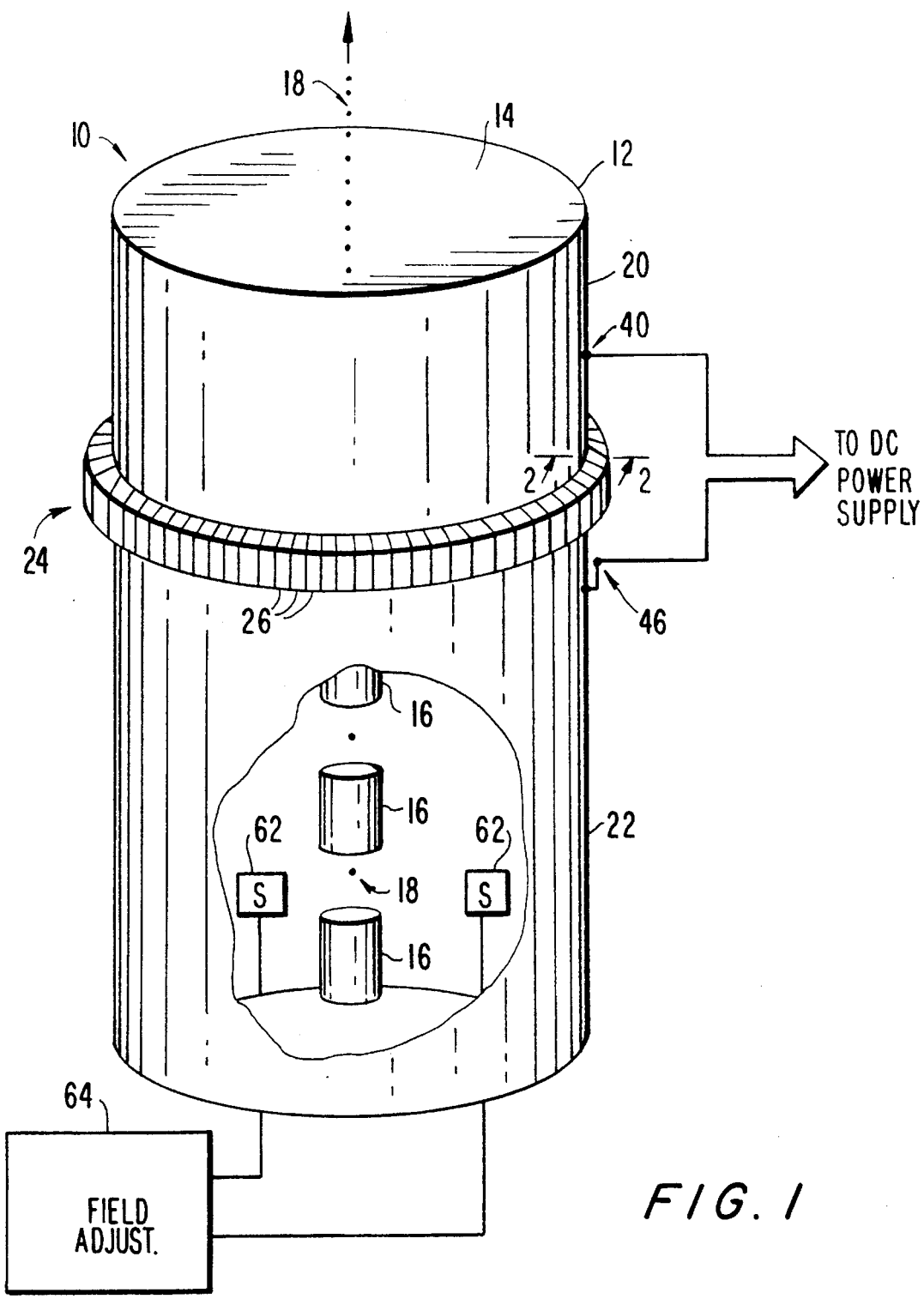
FIG. 1 is a partial-schematic perspective view, partially broken away, of a DTL cavity including active elements in accordance with the present invention.

In FIG. 1, reference numeral 10 generally designates a DTL cavity. Components other than those used for providing power to the cavity 10 are conventional, and so will not be described in detail. Cavity 10 is substantially cylindrical and is defined by a wall 12, which has a conductive inner surface 14. Wall 12 and its inner surface 14 may be constructed, for example, of copper or aluminum. It is also within the contemplation of this invention that inner surface 14 be made of a superconducting material. A conventional arrangement of drift tubes 16 is disposed within cavity 10 and accelerates particles to form a beam 18. It will be understood that the particles are supplied from a conventional particle source (not shown).

The wall 12 is divided into upper and lower cylindrical sections 20 and 22. Installed between sections 20 and 22 is an annular array 24 of solid state power amplifier modules 26. Each of the modules 26 includes a number of RF power chips such as those used in the type MRF 176 GU or the type MRF 392 solid state amplifiers manufactured by Motorola. As is well known to those skilled in the art, such chips include a plurality of transistors arranged to form an RF power amplifier. In some arrangements, for example, the power chip includes a plurality of transistors connected in parallel. It is within the contemplation of this invention that the power chips used in the modules 26 include bipolar junction, field effect or static induction transistors or so-called solid state triodes. The selection of the power chips, the manner of arranging the chips within the modules 26, and the nature of the connections between the modules 26 and the wall sections 20 and 22 (capacitive or conductive coupling, e.g.) are interdependent design choices that also depend on the desired characteristics of the EM field to be generated with the DTL. Such choices are within the abilities of those having ordinary skill in the art and so need not be discussed herein. In order to simplify the drawing, only one annular array 24 of modules 26 is shown in FIG. 1. It should, however, be understood that the type of power chips used may require that several module arrays like array 24 be installed at longitudinal intervals along cavity 10 to achieve the desired acceleration of beam 18. In this case, it will be appreciated that wall 12 would include more than two cylindrical sections and that each of the annular arrays would be installed between a respective adjacent pair of the cylindrical sections.

Figure 2:
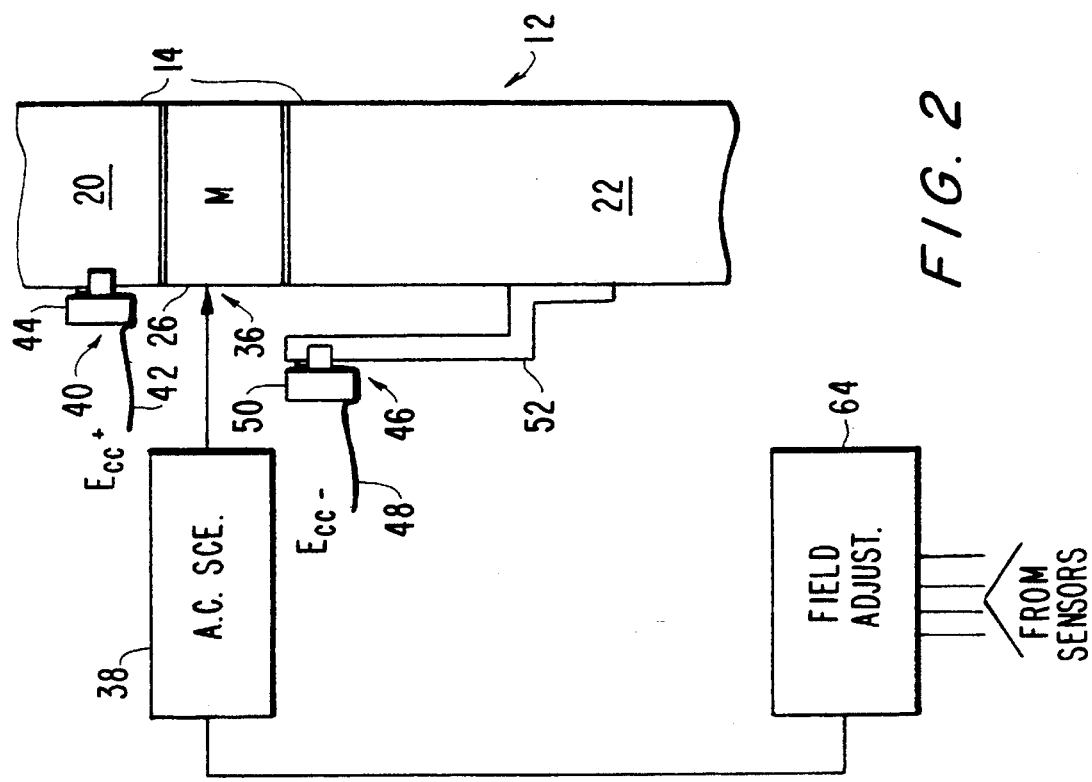
FIG. 2 is a cross-sectional view of a portion of a wall defining the linear accelerator cavity of FIG. 1, taken at line 2—2 of FIG. 1.

A typical section of the wall 12, at a point where a module 26 is installed therein, is schematically shown in FIG. 2. In FIG. 2, a power amplifier module 26(M) is shown installed between wall sections 20 and 22. Connections between module 26 and wall sections 20 and 22 depend, as noted above, on design choices and parameters, and may include, for example, thin films between module 26 and sections 20 and 22 to provide capacitive coupling or alternatively may include conductive connectors (not shown).

Module 26 has an input terminal 36 which is connected to a source 38 of a relatively low power RF driving signal.

A positive d.c. terminal 40, formed of a lead 42 and connector 44 to which d.c. voltage+$E_{cc}$ is supplied, is connected to upper section 20 at an outer surface thereof. Similarly, a negative d.c. terminal 46, formed of a lead 48 and a connector 50 to which d.c. voltage−$E_{cc}$ is supplied, is connected to lower section 22 via a quarter-wavelength choke connection 52 on an outer surface of lower section 22.

Leads 42 and 48 are connected to respective terminals of a d.c. power supply (not shown). The d.c. power supply may be of relatively low voltage, for example in the tens or hundreds of volts range. It will be appreciated that the actual rating for the d.c. power supply will depend on the desired performance of accelerator cavity 10 and other design parameters.

Although only one positive and one negative terminal are shown in FIGS. 1 and 2, it should be understood that the numbers and types of power connections are matters of design choice within the capability of those skilled in the art.

Operation

Figure 3:
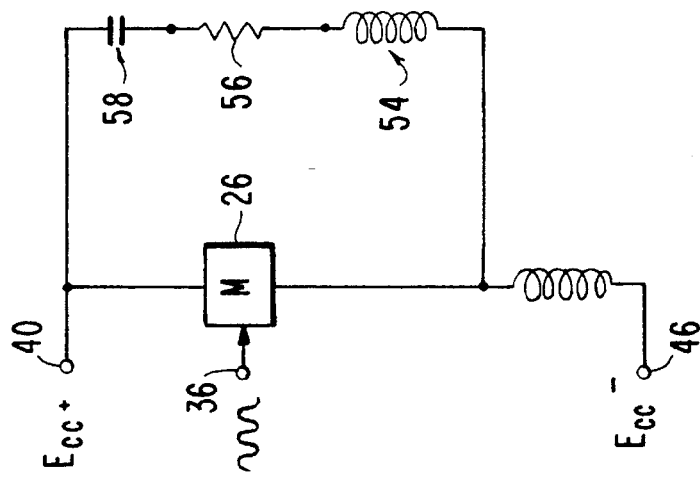
FIG. 3 is a circuit diagram of a circuit that is equivalent to the linear accelerator cavity of FIG. 1.

Operation of DTL cavity 10 will be described with reference to FIG. 3, which is a diagram of a circuit that is equivalent to cavity 10. In the circuit of FIG. 3, power amplifier module 26 represents all of the modules 26 of module array 24, which are connected in parallel between upper section 20 and lower section 22 as seen in FIG. 1. Other circuit elements shown in FIG. 3 which correspond to elements of FIG. 2 are given like reference numerals. Further, as will be understood by those skilled in the art, the accelerator cavity 10 has resonant modes and can be modeled by an RLC circuit represented in FIG. 3 by an inductance 54, a resistance 56, and a capacitance 58 connected in series across module 26.

The RF driving signal applied to the terminals 36 of the modules 26 (as seen in FIGS. 2 and 3) is at a frequency that corresponds to that of the desired resonant mode of cavity 10. Under control of the driving signal, amplifier modules 26 induce a large RF current, with a peak amplitude on the order of several kiloamps, to flow at inner surface 14 of wall 12 in FIG. 1, so that the desired EM field amplitude is established. Due to skin effect, this current flows to a depth of about 1 µm. The d.c. current which passes through the modules flows through the bulk of wall 12, or, if necessary, through additional current bus bars (not shown) that may be installed on the outer surface of wall 12.

It is to be noted that the amplifier modules 26 are low impedance devices (with combined impedances on the order of milliohms) that operate at high-current/low-voltage, while the particle beam along the axis of cavity 10 is at high-voltage/low-current, representing a high impedance load. Thus, the structure serves at once as a power combiner and a matching transformer for the amplifier modules.

A minimal amount of packaging is required within the modules, because the wall 12 of cavity 10 serves as a heat sink for the transistors. The system's total cooling budget is not increased, while most of the packaging, which makes up the heaviest part of a transistor RF power system, is eliminated.

Preferably, RF signal source 38 (see FIG. 2) includes means for adjusting the phase and/or amplitude of the RF driving signal applied to individual ones or groups of the modules 26 so that the modules can be driven independently or in small groups for dynamically stabilizing the electric field and controlling the field profile. As will be appreciated by those skilled in the art, conventional sensors 62 (of which two are shown in FIG. 1; there may be more) may be disposed within cavity 10 for providing data signals regarding field characteristics such as maximum phase and amplitude at given locations within cavity 10. The data signals are supplied to a field adjustment control device 64, such as a computer or other automatic control, to adjust the driving signals for respective modules 26, as seen in FIGS. 1 and 2.

Since the vacuum tubes required for conventional linear accelerators are not required to be provided with accelerator cavity 10, the break-down problems of high voltage equipment in earth orbit are eliminated. Further, the power supply of accelerator cavity 10 as provided in accordance with this invention avoids the RF power transmission loss of conventional accelerators, thereby achieving higher efficiency.

High-Power RF Amplifier

Application of the present invention to a high-power solid state amplifier will now be described with reference to FIG. 4. In FIG. 4, reference number 10' generally refers to a radio-frequency power amplifier cavity. Amplifier cavity 10' is generally similar to the accelerator cavity 10 described with reference to FIGS. 1–3, but lacks the drift tubes 16 and other components needed for accelerating a particle beam. Instead, amplifier cavity 10' includes a waveguide 60, or alternatively a coaxial cable output connector (not shown), for taking out high power EM waves from cavity 10'.

Operation of cavity 10' with respect to generation of an oscillating electric field is the same as for accelerator cavity 10, and so need not be described again. In general, design parameters for amplifier cavity 10' are somewhat different from those of accelerator 10. For example, the maximum field generated in amplifier cavity 10' may only be on the order of tens or hundreds of kilovolts per meter, whereas a maximum field in the order of megavolts per meter is desired for accelerator cavity 10. Similarly, the RF current induced in the wall 12 of cavity 10' may be on the order of a few hundred amperes rather than the kiloamps of RF current present in DTL cavity 10. Accordingly, the number and ratings of the transistors used with cavity 10' are also likely to differ from those used in cavity 10. The requirements for the d.c. power supply are also likely to be different.

The RF power amplifier of FIG. 4 carries advantages as compared to amplifiers that have previously been proposed in which a number of RF power chips, rated on the order of 100 W apiece, have been combined on printed circuit boards. Because of the need to include peripheral components such as strip line circuitry and capacitors and resistors on the printed circuit board and because of problems with cooling the resulting circuitry, the total power output of such amplifiers has only been in the range of a few kilowatts. Such proposed amplifiers also tend to become less efficient as more chips are packaged together on a printed circuit board. It will be appreciated that an RF amplifier in accordance with the embodiment of FIG. 4 overcomes these disadvantages by providing an output on the order of tens to hundreds of kilowatts, if desired, with efficient heat sinking and packaging of the power chips.

Depending upon the nature of the application, the desired strength of the field, and the power chips selected, the number of modules 26 may be on the order of 100 and the number of chips per module may be 8 or 10. It is within the contemplation of the invention that the modules 26 of array 24 may be installed at intervals on the circumference of cavity 10 or 10', rather than forming an array that girdles cavity 10 or 10' without intervals, as shown in FIGS. 1 and 4. It is also contemplated, as mentioned earlier, that more than one array 24 may be installed, in which case, wall 12 would be divided into more than two cylindrical sections. It is further within the contemplation of the invention that the power chips would be mounted directly, i.e. not in modular form, within wall 12.

Radio Frequency Quadrupole Accelerator

Another type of linear particle accelerator, according to an alternative embodiment of the invention, will now be described with reference to FIGS. 5A and 5B.

Figure 5A:
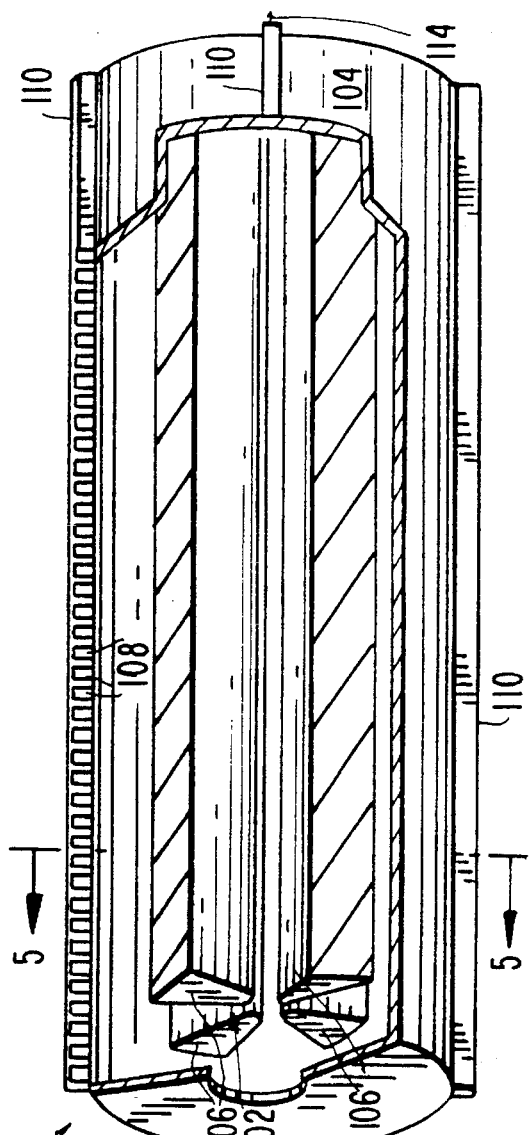
FIG. 5A is a partial-schematic perspective view, partially broken away, of a radio frequency quadrupole (RFQ) in accordance with the present invention.
Figure 5B:
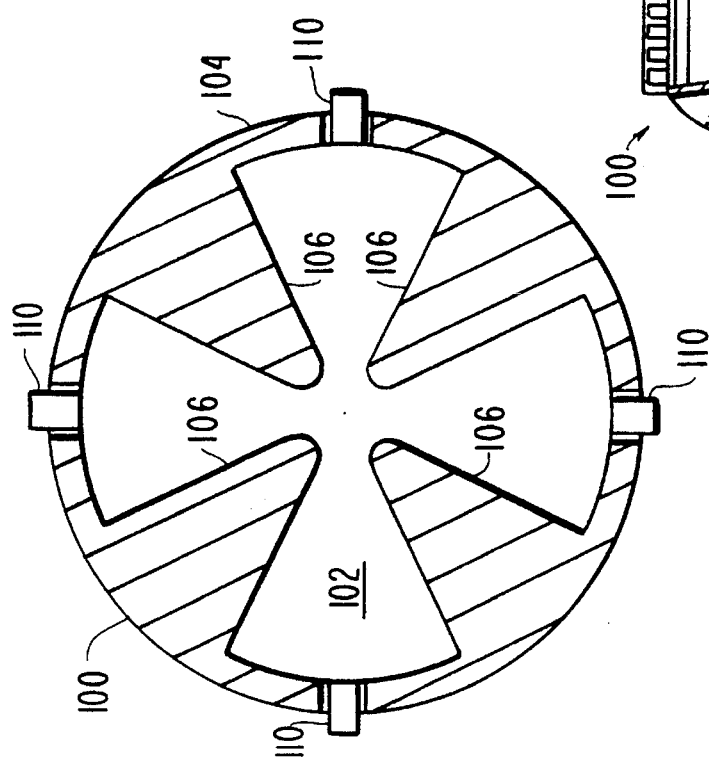
FIG. 5B is a cross-sectional view of the RFQ of FIG. 5A taken at the line 5—5 in FIG. 5A.

In FIGS. 5A and 5B, reference numeral 100 generally refers to a radio frequency quadrupole (RFQ) linear accelerator. RFQ 100 includes a resonant cavity 102 defined by a substantially cylindrical wall 104 composed of a conductive material such as copper or aluminum. As best seen in FIG. 5B (and also FIG. 5A), four conductive vanes 106 extend radially inwardly from wall 104 and also extend longitudinally along the inner surface of wall 104. It will also be noted that the vanes 106 are spaced apart from each other at substantially equal intervals along the inner circumference of wall 104, dividing the cavity into four quadrants.

Except for the RF power circuitry to be described below, RFQ 100 is of conventional construction and may be, for example, similar to the devices described in "Transmission Line Modeling of Beam Loading and Other Perturbations in an RFQ", B. R. Cheo, J. Shmoys, M. -K. Ke and R. M. Jones, *Particle Accelerators*, 1992, Vol. 39, pp. 47–63, and references cited therein.

In a manner similar to the DTL shown in FIGS. 1–3, RF power for forming an EM field within cavity 102 is provided by a plurality of solid state power amplifier modules 108 installed within the wall 104 (see FIG. 5A). More specifically, the modules 108 are arranged in four linear arrays 110 that extend longitudinally along wall 104 at locations that are spaced at regular intervals along the circumference of wall 102 and intermediate the four vanes 106 (FIGS. 5A and 5B).

Although not shown in the drawings, it will be appreciated that a d.c. power supply, and RF driving signal sources, analogous to those indicated in FIGS. 2 and 3, are associated with RFQ 100. The phases of respective RF driving signals provided to the four module arrays 110 are such that adjacent vanes 106 are of opposite polarity. The frequency of the RF driving signals is the resonant frequency of the desired mode of resonant cavity 102. Carvings in the shape of waves and known as scallops are cut into vane edges (not shown). The resulting EM field, formed with the aid of the scallops, bunches and accelerates particles supplied from a conventional beam source 112 so that a particle beam 114 is emitted from RFQ 100.

It will be appreciated that sensing of EM field characteristics, and phase and/or amplitude adjustment of the RF driving signals, as discussed with respect to the DTL of FIGS. 1–3, may be applied to the RFQ of FIGS. 5A and 5B.

The RFQ described herein shares the advantages of the previously described DTL, namely lower weight, easier transportability, and greater efficiency, because of the elimination of the conventional feed lines and power generation equipment.

Linear Accelerator With Plural Aligned Cavities

In another known type of linear accelerator, a plurality of resonant cavities are aligned and the timings of the EM fields in the respective cavities are set so that a particle beam is accelerated from cavity to cavity, gaining energy along the way. According to the conventional manner of providing power for the respective cavities, RF waves are fed into the first cavity and then side coupling chambers are arranged between each adjacent pair of cavities, so that the field power is transmitted through all of the cavities.

A linear accelerator 120, in accordance with the present invention, and which dispenses with side coupling chambers, is illustrated in FIG. 6. Linac 120 includes resonant cavities 122-1, 122-2, ... through 122-6 defined by respective conductive walls 124-1, 124-2, ... 124-6. Particles 126 from a beam source 128 are introduced into the first cavity 122-1. It will be noted that the cavities 122-1, 122-2, ... 122-6 are aligned and have aperture portions 130-1, 130-2, ... 130-5 connected between adjacent pairs of the cavities so that a particle beam 132 is accelerated by the respective EM fields from one cavity to the next until the beam 132 emerges from cavity 122-6.

Each of cavities 122-1, 122-2, ... 122-6 is substantially cylindrical and is girdled by an annular array 134 of power amplifier modules 136. Each of these cavities is generally similar to the DTL cavity 10 discussed above, except that cavities 122-1, 122-2, ... 122-6 do not have drift tubes. Each module array 134 is connected to a respective low power RF signal source 138 and receives therefrom a respective RF driving signal. Although not shown in FIG. 6 for the sake of simplifying the drawing, it will be understood that linac 120 also has a d.c. power source or sources connected to each of the cavities 122-1, 122-2, ... 122-6. It will also be appreciated that under control of the respective RF signals supplied thereto, the power module arrays 134 induce large amplitude currents at the inner surfaces of the respective walls 124 so that desired EM fields are formed within the cavities 122-1, 122-2, ... 122-6. A source controller 140 is connected to all of the RF sources 138 for providing thereto respective control signals which control the phase and amplitude of the RF driving signal output by the respective RF source 138. The control signals, in turn, are based on signals received by controller 140 from sensors (not shown) which sense characteristics of the respective EM fields of the cavities 122-1, 122-2, ... 122-6. The control signals are also based on command signals received by controller 140 via an operator interface (not shown). It will be appreciated that controller 140 is preferably realized electronically, for instance with microprocessor control. It should also be understood that controller 140 may also manage other aspects of linac 120, such as tuning mechanisms.

With this arrangement, the power source, i.e. power modules 134, for each cavity 122-1, 122-2, ... 122-6 may be driven independently, so that the EM fields generated in the respective cavities are more stable and more easily adjustable than the fields provided in conventional coupled cavity linacs. It will be understood that the advantages of lower weight, easier transportability, and greater efficiency as described with respect to the previous linacs are also realized in the linac of FIG. 6. A linac having more than the six cavities or fewer than the six cavities shown in FIG. 6 is within the contemplation of this invention, as is a charged particle accelerator that includes a stage in which two or more accelerator cavities, like the cavities of FIG. 6, are aligned.

It is also within the contemplation of this invention that an EM field generating cavity with integrated power modules, as disclosed herein, be applied to other types of particle accelerators, such as accelerators of the re-entrant type. Also, although the accelerators disclosed herein utilize standing wave EM fields, it is contemplated that the active RF cavity disclosed herein may be applied to travelling wave accelerators.

It should be understood that the frequencies at which DTL 10, amplifier cavity 10', RFQ 100 or linac 120 may operate include the microwave range and other frequencies at which conventional RF power amplifiers or linear accelerators are operated. Therefore, as used in the following claims, "RF" shall be understood to include all of these frequencies.

The above description of the invention is intended to be illustrative and not limiting. Various changes or modifications in the embodiments described may occur to those skilled in the art and these can be made without departing from the spirit or scope of the invention.

What is claimed is:

1. An active RF cylindrical resonant cavity having a resonant frequency, comprising:

a conductive wall defining said cylindrical resonant cavity, said conductive wall being comprised of at least two longitudinal sections; and a plurality of individual solid state power transistors respectively mounted between adjacent ones of the at least two sections of said conductive wall and being electrically connected to the adjacent ones of said at least two sections, said solid state power transistors being responsive to an RF driving signal for inducing an RF current at an inner surface of said conductive wall so that an electromagnetic (EM) field oscillating at said resonant frequency is provided within said cylindrical resonant cavity.

2. An active RF cavity according to claim 1; wherein said RF current has a peak amplitude of at least 100 amperes and a frequency of at least 100 MHz, and said solid state power transistors collectively transfer RF power in excess of 10 KW to said cavity.

3. An active RF cavity according to claim 2; wherein said solid state power transistors collectively transfer RF power in excess of 100 KW to said cavity.

4. An active RF cavity according to claim 2; wherein said RF current has a peak amplitude of at least one kiloamp.

5. An active RF cavity according to claim 1; wherein said solid state power transistors are connected in parallel.

6. An active RF cavity according to claim 1; further comprising means for introducing charged particles into said cavity; and means disposed within said cavity for applying said oscillating EM field to said charged particles to accelerate said charged particles whereby said active RF cavity functions as a particle accelerator.

7. An active RF cavity according to claim 1; wherein said conductive wall includes at least three cylindrical sections and said solid state power transistors are arranged in a plurality of arrays of modules, each of said arrays being installed between a respective adjacent pair of said at least three cylindrical sections, and each of said modules including a plurality of said solid state power transistors.

8. An active RF cavity according to claim 1; further comprising signal source means coupled to said power transistors for applying said RF driving signal to each of said solid state power transistors.

9. An active RF cavity according to claim 8; further comprising:

sensor means disposed within said cavity for sensing a predetermined field characteristic of said EM field; and means responsive to said sensor means and connected to said signal source means for adjusting respective RF driving signals applied to said solid state power transistors.

10. An active RF cavity according to claim 9; wherein said means responsive to said sensor means is operable to phase adjust the respective RF driving signals applied to said solid state power transistors.

11. An active RF cavity according to claim 10; wherein said means responsive to said sensor means is further operable to amplitude adjust the respective RF driving signals applied to said solid state power transistors.

12. An active RF cavity according to claim 1; further comprising a positive d.c. power terminal connected to one of said longitudinal sections and a negative d.c. power terminal connected to another of said longitudinal sections.

13. An active RF cavity according to claim 12; wherein said positive and negative d.c. power terminals are at respective potential levels that differ by no more than 1,000 V, and wherein said electric field has a peak amplitude of at least 100 KV per meter.

14. An active RF cavity according to claim 13; wherein said EM field has a peak amplitude of at least 1 MV per meter.

15. An active RF cavity according to claim 1; further comprising means coupled to said cavity for introducing charged particles into said cavity so that said charged particles are accelerated by said oscillating EM field.

16. An active RF cavity according to claim 1; further comprising means for taking out high-power EM waves from said cavity.

17. An active RF cavity according to claim 16, wherein said means for taking out said high-power EM waves from said cavity includes a wave guide operatively coupled to said cavity.

18. An active RF cavity according to claim 16; wherein said means for taking out said high-power EM waves from said cavity includes a coaxial cable operatively coupled to said cavity.

* * * * *